United States Patent
Murugesh et al.

[11] Patent Number: 5,811,356
[45] Date of Patent: Sep. 22, 1998

[54] REDUCTION IN MOBILE ION AND METAL CONTAMINATION BY VARYING SEASON TIME AND BIAS RF POWER DURING CHAMBER CLEANING

[75] Inventors: Laxman Murugesh, Fremont; Pravin Narwankar, Sunnyvale; Turgut Sahin, Cupertino; Kent Rossman, Sunnyvale, all of Calif.

[73] Assignee: Applied Materials, Inc., Santa Clara, Calif.

[21] Appl. No.: 704,428

[22] Filed: Aug. 19, 1996

[51] Int. Cl.$^6$ ........................................ H01L 21/00
[52] U.S. Cl. .......................... 438/711; 438/905; 134/1.1; 134/4; 216/67
[58] Field of Search .................. 134/1.1, 2, 4, 104.1; 156/345, 643.1; 118/723 I, 723 R; 216/67, 68; 438/788, 905, 711; 427/569

[56] References Cited

U.S. PATENT DOCUMENTS

| | | | |
|---|---|---|---|
| 4,795,880 | 1/1989 | Hayes et al. | 219/121.52 |
| 5,041,311 | 8/1991 | Tsukune et al. | 427/255.3 |
| 5,514,246 | 5/1996 | Blalock | 156/643.1 |
| 5,589,041 | 12/1996 | Lantsman | 204/192.33 |
| 5,599,396 | 2/1997 | Sandhu | 118/723 I |

*Primary Examiner*—R. Bruce Breneman
*Assistant Examiner*—Luz Alejandro
*Attorney, Agent, or Firm*—Patterson & Streets, LLP

[57] ABSTRACT

The present invention provides a method and apparatus for reducing the concentration of mobile ion and metal contaminants in a processing chamber by increasing the bias RF power density to greater than 0.051 W/mm$^2$ and increasing the season time to greater than 30 seconds, during a chamber seasoning step. The method of performing a season step in a chamber by depositing a deposition material under the combined conditions of a bias RF power density of about 0.095 W/mm$^2$ and a season time of from about 50 to about 70 seconds, reduces the mobile ion and metal contaminant concentrations within the chamber by about one order of magnitude.

18 Claims, 2 Drawing Sheets

REDUCTION IN MOBILE ION AND METAL CONTAMINATION BY VARYING SEASON TIME AND BIAS RF POWER DURING CHAMBER CLEANING

BACKGROUND OF THE DISCLOSURE

1. Field of the Invention

The present invention relates to an apparatus and method for reducing contaminant concentrations in a processing environment. More particularly, the present invention relates to a method and apparatus for reducing mobile ion and metal contaminant concentrations within a processing environment by varying the process conditions during a season step.

2. Background of the Related Art

High density plasma (HDP) processes are important processes used in the fabrication of integrated circuits. HDP processes can be used to advantage to deposit thin films or etch films on a substrate to form integrated circuits. As with other deposition and etch processes, an important consideration is the level of contaminants present in the processing environment. In HDP processes, this is important because the high density plasma typically creates higher temperatures within the process chamber. As the temperature in the process chamber increases, the likelihood that undesirable mobile ion and metal contaminants will be driven out of chamber components increases. Therefore, particle counts within the HDP process environment may be unfavorably high.

One process presently used to reduce the particle count in an HDP chemical vapor deposition process is to form a thin film of the deposition material on the chamber components following a plasma assisted cleaning process. This step is typically referred to as seasoning the chamber and is typically performed using a process recipe which may include the use of both a capacitive and an inductive source. The effect of a capacitive and an inductive plasma on the various chamber components will be discussed below following a description of a typical HDP-CVD chamber. The present invention will be described in reference to an HDP-CVD process, however, the invention may be used to advantage in any HDP process system.

Figure 1:
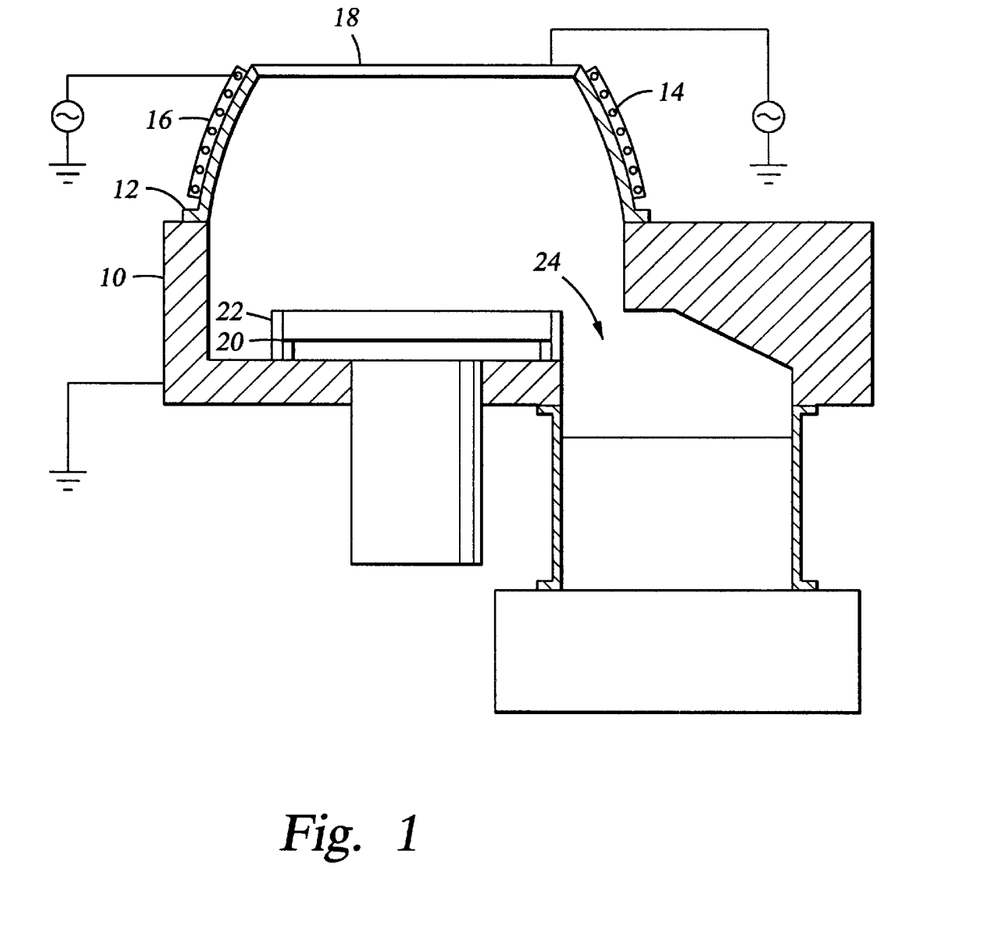
FIG. 1 is a schematic view of a HPD-CVD process chamber.

Referring to FIG. 1, a cross-sectional view of an HDP-CVD chamber is shown. The chamber generally includes a chamber body 10 which is typically made of aluminum and functions as an anode. The chamber body 10 supports a dielectric dome 12 on its upper edge around which an inductive coil 14 is located to provide an inductive plasma source. The inductive coil is typically insulated in an insulative coil holder 16 which prevents arcing between the turns of the coil. A conducting or semi-conducting chamber lid 18 is supported on the upper surface of the dielectric dome 12 and functions as another anode within the chamber. An electrostatic chuck 20 is positioned in the lower portion of the chamber to support a substrate thereon during processing. An insulative ring 22 made of a dielectric material, such as a ceramic, is typically positioned around the outer perimeter of the electrostatic chuck 20 to prevent arcing between the electrostatic chuck and the grounded chamber walls. Gases are inlet through gas inlets (not shown) located around the perimeter of the chamber body 10 and in the chamber lid 18 above the electrostatic chuck 20. The chamber is exhausted through an exhaust passage 24 positioned outwardly of the outer edge of the electrostatic chuck 20 by an exhaust pump (not shown). A throttle and gate valve assembly control pressure within the chamber by controlling the exhaust of gases out of the chamber.

Typically, a high density plasma is generated within the processing chamber by providing an RF voltage through the inductive coil adjacent the dielectric dome, referred to as source RF. The RF voltage applied to the coil and the lid excite a gas introduced into the chamber into a plasma state. In addition, an RF voltage may be coupled to the chamber lid 18 to provide a bias RF signal into the chamber. Depending on the application, precursor gases may be introduced into the chamber to deposit a material onto the substrate or etch material from the substrate to form integrated circuits on the substrate.

The conducting or semi-conducting lid 18, the dielectric ring 22, the ceramic dome 12, the enclosure wall 10 and gas inlets 15, all of which form a part of the plasma processing region, are sources of contaminant material which may be volatilized into the gas phase under operating conditions within the chamber, thereby contaminating the processing environment. Specifically, mobile ions such as Na, Li, and K, and metal particles such as Fe, Cr, Ar, Ni, and Mg, may be leached out of the chamber components when a capacitive or an inductive plasma is struck in the chamber. Incorporation of these mobile ions and metal particles into the deposited films compromises the structural integrity and electrical performance of the devices formed on the substrate. Furthermore, deposits on the chamber components can buildup after a series of substrates have been processed, and become another source of particles that can flake off and damage the circuits, despite being of similar composition.

Particle contamination within the chamber is controlled by periodically cleaning the chamber using cleaning gases, typically fluorinated compounds, and inductively and capacitively coupled plasmas. Inductively and capacitively coupled plasma cleaning processes are effective at cleaning different components of the chamber. For, an inductive clean process effectively cleans the insulative chamber parts (i.e., quartz and ceramic parts) by thermally activated etching. The capacitive clean process effectively cleans the metal surfaces, which can be powered or grounded, by ion assisted etching. Cleaning gases are selected based on their ability to bind the precursor gases and the deposition material which has formed on the chamber components in order to form stable products which can be exhausted from the chamber, thereby cleaning the process environment. In a high density plasma reactor, most cleaning gases containing fluorine (ie., $NF_3$, $CF_4$, and $C_2F_6$) are highly dissociated and can readily bind the deposition material forming a stable product which can be exhausted from the chamber.

Once the chamber has been sufficiently cleaned of the process gases and the cleaning by-products have been exhausted out of the chamber, a season step is performed to deposit a layer of material onto components of the chamber forming the processing region to seal the contaminants therein and reduce the contamination level during processing. This step is typically carried out by depositing a film to coat the interior surfaces forming the processing region in accordance with the deposition process recipe.

As one process example, silane gas can be introduced into the chamber and oxidized to deposit a layer of silicon dioxide according to the following equation:

$$SiH_4 + O_2 \rightarrow SiO_2 + 2H_2 \qquad \text{EQUATION 1}$$

In a 200 mm application, a deposition process may typically be carried out at a source RF power of about 4500 W and a bias RF power of about 2500 W. The season step in this application is carried out at a source RF power of about 4500 W and a bias RF power of about 1600 W.

In a 300 mm application, the deposition process may be carried out at source RF power of about 10,125 W and a bias RF power of about 5625 W. The season step may be carried out at a source RF power of about 10,125 W power and a bias RF power of about 3600 W.

In another example, silicon tetraflouride can react with oxygen according to the following equation:

$$SiF_4 + O_2 \rightarrow Si\, O_xF_y \qquad \text{EQUATION 2}$$

While depositing a film layer according to the process recipe during a season step has been moderately successful in reducing contaminant concentrations, contaminant levels have still been measured on the order of about 1500 ppb mobile ions and about 200 ppb metals. As circuit geometries decrease, contaminant concentrations below these levels become even more desirable.

Therefore, there exists a need for a method and apparatus for further reducing contaminants within a processing environment. It would be advantageous to provide a method which would not increase the overall time required to clean the chamber and deposit a film layer on the exposed chamber components. Still further, it would be advantageous to utilize a normal processing system configuration to provide a method of reducing contaminant levels in a chamber by varying the power applied to the chamber or increasing season times.

SUMMARY OF THE INVENTION

In accordance with a method of the present invention, mobile ion contamination can be reduced significantly by increasing the bias RF power used during the chamber season step which is carried out after the chamber has been cleaned using cleaning gases, typically fluorinated compounds. The bias RF power is preferably increased by at least about 15% to provide a power density of at least about 0.051 W/mm$^2$ to achieve a reduction in mobile ion contamination of about one order of magnitude from the level previously obtained using a lower bias RF power.

In addition to a reduction in mobile ion contamination, metal contamination can be reduced in accordance with another method of the present invention by increasing the season time from about 30 seconds up to about 110 seconds, or to any time therebetween. Longer time may be employed, but an increase in throughout will result and the likelihood that the thicker seasoning film may flake off increases. An increase in the season time reduces the metal contamination by about one order of magnitude.

In accordance with still another aspect of the present invention, a season bias RF power providing a power density of about 0.095 W/mm$^2$ to about 0.11 W/mm$^2$ with season time of about 50 to about 70 seconds results in metal contamination below about 50 ppb and mobile ion contamination below about 70 ppb.

The present invention provides a method for reducing the level of contaminants in a processing chamber, comprising the steps of:

a) providing a cleaning gas into the chamber;

b) providing an RF bias through an inductive coil to clean the insulative components of the chamber;

c) providing an RF bias to the chamber lid and the chamber walls to clean the conducting and semiconducting components of the chamber; and d) seasoning the chamber by depositing a film onto the chamber components by providing precursor gases into the chamber and providing a bias RF power sufficient to provide a power density of at least 0.051 W/mm$^2$ and a source RF power sufficient to provide a power density of at least 0.051 W/mm$^2$ to the chamber and depositing the material for a period of from about 30 to about 110 seconds.

A method is also provided for reducing particle concentrations within a processing environment comprising the steps of:

a) flowing precursor gases into the chamber;

b) providing a bias RF power to provide a power density of from about 0.051 W/mm$^2$ to about 0.14 W/mm$^2$ and a source RF power to provide a power density of from about 0.095 W/mm$^2$ to about 0.15 W/mm$^2$ to the chamber;

c) depositing a deposition material within the chamber on the components of the chamber exposed to the deposition environment.

In another aspect of the invention, a method for seasoning the internal surfaces of a processing chamber having a lid and an inductive coil is provided, comprising the steps of:

a) supplying a deposition precursor gas into the chamber; and b) providing a bias RF power density of about 0.08 W/mm$^2$ and a source RF power density of about 0.14 W/mm$^2$ to the chamber and depositing a material for a period of about 30 to about 110 seconds.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF THE PREFERRED EMBODIMENT

The inventors have discovered that the season time and the bias RF power employed during the season step of the chamber seasoning process affect the level of mobile ion and metal contaminants within the process environment during processing. It has been discovered that the concentration of mobile ions (i.e., Na, Li and K) can be reduced by increasing the bias RF power used during the season step, while the concentration of metal contaminants (i.e., Fe, Cr, Ni, Al, Mg) can be reduced by increasing the time during which the season step is performed. By increasing the bias RF power by about fifteen percent (15%) over the process recipe to provide a power density of at least about 0.051 W/mm$^2$, while maintaining the same season time, the sodium contamination areal density can be decreased from 1.07 E+11 at/cm$^2$(1517 ppb) to 7.23 E+09 at/cm$^2$(71 ppb).

Figure 2:
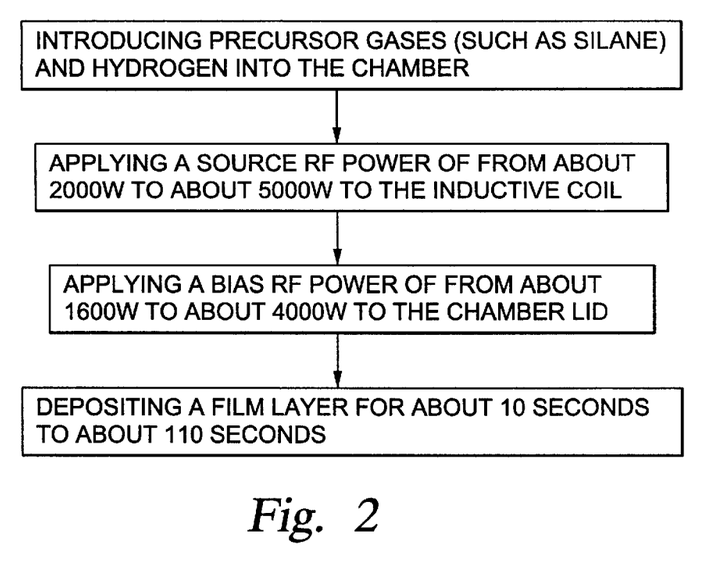
FIG. 2 is a flow diagram illustrating a process of the present invention.

Referring to FIG. 2, a flow diagram of the process of the present invention is shown. Preferably, a clean process is performed in the chamber by introducing cleaning gases, such as $NF_3$, $CF_4$, $C_2F_6$, or any other cleaning gases used in the industry, and striking a plasma, preferably including both an inductively and a capacitively coupled plasma, in the process chamber according to methods known in the art. The gaseous reaction products formed between the cleaning gases and the deposition material and contaminants present within the chamber are exhausted out of the chamber. After both the inductive and capacitive clean processes have been performed in the chamber, the chamber is preferably seasoned by depositing a quantity of the deposition material onto the chamber components exposed to the process environment. In accordance with one process recipe, silane is supplied to the chamber to react with $O_2$ as shown in Equation 1 above to form a film layer of silicon dioxide on the chamber components. Another process which can be used is shown in Equation 2. However, these processes are only illustrative and it should be understood that other recipes used in HDP plasma processes may be used in accordance with the present invention.

Existing processes recommend that the season step be carried out according to the same process recipe used to deposit the material on a substrate, but typically at a lower bias RF power to form a coating layer of the deposition material on the chamber components, while subjecting the chamber components adjacent the processing region to conditions approaching the processing environment. While contamination levels in the chamber attainable with this method may be suitable for some processes, smaller geometries and increased circuit density require that contamination levels be further reduced. Accordingly, the inventors have discovered that the season step conditions can be manipulated to further reduce contaminant levels by subjecting the chamber components to higher process temperatures.

In accordance with the present invention, a plasma is generated by providing a source RF power to the inductive coil located adjacent to the dielectric dome to provide a density of about $0.064$ $W/mm^2$ to about $0.159$ $W/mm^2$ and a bias RF power density of at least about $0.051$ $W/mm^2$ to the chamber. Typically, the chamber walls are grounded. The precursor gases, e.g., silane and $O_2$, are supplied to the chamber and react to form a $SiO_2$ film layer on the exposed surfaces of the chamber components.

It is believed that using a higher bias RF power results in a hotter process kit, which includes the dielectric dome and the dielectric ring, and results in volatilization of mobile ions out of the process kit and also increased sputtering of the process kit. The volatilized mobile ions deposit on cooler surfaces within the chamber, typically away from the support member (electrostatic chuck) where the substrate will be positioned for processing.

The present invention may be more fully understood through the use of examples which are described below. While the following examples were performed using 200 mm substrates, the invention is equally applicable with processes useful in 300 mm applications or any size substrate or chamber which may be presently used or which may later be used in the industry.

EXAMPLE I

The following example demonstrates the efficacy of the present invention. This example was undertaken using a high density plasma chemical vapor deposition chamber, and in particular, a "CENTURA HDP-CVD" system with a two-piece quartz process kit, both fabricated and sold by Applied Materials, Inc., Santa Clara, Calif.

Silicon substrates having a diameter of 200 mm (8 inches) and a thickness of 0.73 mm were used in this example. Eleven (11) substrates were positioned in slots 2–12 in a wafer cassette and processed as follows. A 2200 Å $SiO_2$ film was first deposited on each bare silicon substrate according to the reaction in Equation 1 set out above. The substrate was then moved out of the process chamber and a chamber clean, including a season step, was performed following the deposition of the first 2200 Å $SiO_2$ film according to the parameters set forth in Table 1 below. The bias RF power and season times employed during the season step of the clean processes were varied for each of the substrates as set forth in Table 1 below.

TABLE 1

Parameters used for season step of clean recipe prior to second 2200 Å $SiO_2$ deposition.

| Slot No. | Source RF Power | Bias RF Power | Season Time (sec) |
|---|---|---|---|
| 2 | 4500 | 1600 | 30 |
| 3 | 4500 | 1600 | 50 |
| 4 | 4500 | 1600 | 70 |
| 5 | 4500 | 1600 | 90 |
| 6 | 4500 | 1600 | 110 |
| 7 | 4500 | 2500 | 30 |
| 8 | 4500 | 2500 | 50 |
| 9 | 4500 | 2500 | 70 |
| 10 | 4500 | 2500 | 90 |
| 11 | 4500 | 2500 | 110 |
| 12 | 4500 | 3000 | 30 |

Subsequently, the substrate was moved back into the process chamber and a second 2200 Å $SiO_2$ film was deposited over the first 2200 Å $SiO_2$ following the clean process. The processed substrates were then analyzed using Secondary Ion Mass Spectroscopy (SIMS) and Magnetic Sector (MS) analysis to determine the particle count for contaminants present in the films. A quadrupole (Phi 6600) SIMS instrument was used to detect the mobile ion contaminants since it provides effective charge compensation and minimizes the tendency of the alkali elements to migrate under the influence of a charged particle beam. The metal contaminants were detected by MS analysis. MS analysis provides high mass resolution that can unambiguously provide mass identification and provides improved detection limits by about one order of magnitude for the metal contaminants.

Figure 3:
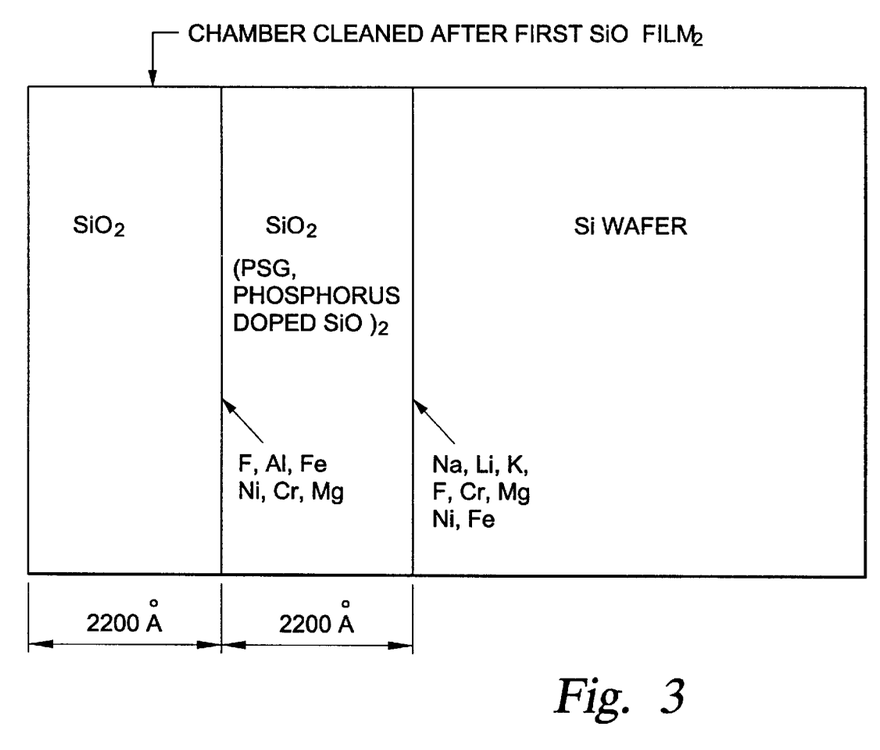
FIG. 3 is a cross-section of a substrate having two silicon dioxide layers formed thereon.

FIG. 3 is a schematic cross-section of a silicon wafer on which two 2200 Å $SiO_2$ film layers were deposited which shows the locations on the wafer and $SiO_2$ film layers where the highest peak concentrations for certain contaminants were found. As shown in FIG. 3, the mobile ion contaminants tend to migrate to the $Si/SiO_2$ interface, while most of the metallic contaminants are concentrated at the $SiO_2/SiO_2$ interface. The mobility of the contaminants through the $SiO_2$ films is a function of the size of the atom and its ability to diffuse through the $SiO_2$ matrix. Thus, the relatively small size of the alkali metals enables these contaminants to diffuse all the way to the $SiO_2/Si$ interface.

Tables 2 and 3 show the areal densities ($at/cm^2$) of the mobile ion and metal contaminants present at select locations on the processed substrates. Referring to Table 2, the areal densities of the mobile ions decrease on average one order of magnitude as the bias RF power increases from 1600 W to 3000 W (power density of about $0.051$ $W/mm^2$ to about $0.095$ $W/mm^2$). For example, the areal density of Na present at the interface between the Si wafer and the first $SiO_2$ film decreased from $1.07$ $E+11$ $at/cm^2$ on the wafer in slot 2 to 7.23 E+9 at/cm$^2$ at the interface on the wafer in slot 12. A similar reduction was seen in the areal densities of Li (from 6.43 E+09 at/cm$^2$ to 2.90 E+08 at/cm$^2$), F (from 1.80 E+13 at/cm$^2$ to 1.77 E+12 at/cm$^2$), and K (from 1.45 E+10 at/cm$^2$ to 3.13 E+09 at/cm$^2$).

Table 3 shows the reduction in the areal densities of the metal contaminants at the SiO$_2$/SiO$_2$ interface. This table compares the areal densities of the contaminants on the wafers in slots 2 and 6 and slots 7 and 11 where the season times were increased from 30 seconds to 110 seconds. As shown in the table, the areal density of Fe at the SiO$_2$/SiO$_2$ interface decreased from 6.8 E+10 at/cm$^2$ to 8.0 E+09 at/cm$^2$ from slot 2 to slot 11. The absence of a detectable difference in the areal density of Fe present on the wafers in slots 6 and 11 seems to indicate that an increase in the season time and not an increase in the bias RF power results in a decrease in the concentration of metal contaminants. Similarly, the reduction in the areal density of Cr from 3.6 E+10 at/cm$^2$ to 5.4 E+09 at/cm$^2$ between the wafers in slots 2 and 11 is seen when the season time is increased from 30 seconds to 110 seconds. The bias RF power had a slight affect reflected in a slightly higher areal density of Cr of 5.2 E+09 at/cm$^2$ on the wafer in slot 6. Finally, the areal density of Al decreased from

TABLE 2

| | | | | | |
|---|---|---|---|---|---|
| | | (Mobile Ions) Areal densities (atoms/cm2) | | | |
| | Li | Na | F | Al | K |
| slot 2 | | | | | |
| 14153a15 | | | | | |
| middle of water | \ | \ | 1.10E + 14 | 1.72E + 11 | 2.25E + 09 |
| at −0.42 um | \ | \ | \ | \ | 1.45E + 09 |
| at interface | 6.43E + 09 | 1.07E + 11 | 1.80E + 13 | \ | 1.45E + 10 |
| slot 3 | | | | | |
| 14153a16 | | | | | |
| middle of water | \ | \ | 8.66E + 13 | 6.25E + 10 | 1.02E + 09 |
| at −0.42 um | \ | \ | \ | \ | 2.73E + 09 |
| at interface | 3.20E + 09 | 5.83E + 10 | 2.00E + 13 | \ | 1.81E + 10 |
| slot 4 | | | | | |
| 14153a17 | | | | | |
| middle of water | \ | \ | 6.78E + 13 | \ | \ |
| at −0.42 um | \ | \ | \ | \ | \ |
| at interface | 1.36E + 09 | 3.36E + 10 | 1.16E + 13 | \ | 8.66E + 09 |
| slot 5 | | | | | |
| 14153a18 | | | | | |
| middle of water | \ | \ | 7.15E + 13 | \ | \ |
| at −0.42 um | \ | \ | \ | \ | \ |
| at interface | 1.29E + 09 | 5.69E + 10 | 1.41E + 13 | \ | 6.62E + 09 |
| slot 6 | | | | | |
| 14153a19 | | | | | |
| middle of water | \ | \ | 3.95E + 13 | \ | \ |
| at −0.42 um | \ | \ | \ | \ | \ |
| at interface | 8.39E + 08 | 5.50E + 10 | 6.45E + 12 | \ | 6.33E + 09 |
| slot 7 | | | | | |
| 14153a20 | | | | | |
| middle of water | \ | 2.06E + 09 | 8.73E + 13 | 3.28E + 11 | 7.12E + 09 |
| at −0.42 um | \ | \ | \ | \ | \ |
| at interface | 2.41E + 09 | 5.71E + 10 | 8.92E + 12 | 2.87E + 10 | 1.63E + 10 |
| slot 8 | | | | | |
| 14153a21 | | | | | |
| middle of water | \ | \ | 8.22E + 10 | \ | 3.65E + 09 |
| at −0.42 um | \ | \ | \ | \ | \ |
| at interface | 1.74E + 09 | 8.08E + 13 | 1.27E + 13 | \ | 1.36E + 10 |
| slot 9 | | | | | |
| 14153a22 | | | | | |
| middle of water | \ | \ | 7.58E + 13 | \ | 4.02E + 09 |
| at −0.42 um | \ | \ | \ | \ | \ |
| at interface | 1.26E + 09 | 6.77E + 10 | 1.11E + 13 | \ | 1.07E + 10 |
| slot 10 | | | | | |
| 14153a23 | | | | | |
| middle of water | \ | \ | 5.38E + 13 | 5.96E + 10 | \ |
| at −0.42 um | \ | \ | \ | \ | 2.02E + 09 |
| at interface | 2.80E + 09 | 7.86E + 10 | 1.94E + 13 | \ | 1.90E + 10 |
| slot 11 | | | | | |
| 14153a24 | | | | | |
| middle of water | \ | \ | 5.82E + 13 | \ | 3.56E + 09 |

TABLE 2-continued (Mobile Ions)
Areal densities (atoms/cm2)

|  | Li | Na | F | Al | K |
|---|---|---|---|---|---|
| at −0.42 um | \ | \ | \ | \ | 2.86E + 10 |
| at interface | 2.28E + 09 | 8.42E + 10 | 1.80E + 13 | \ | 2.35E + 09 |
| slot 12 |  |  |  |  |  |
| 14153a25 |  |  |  |  |  |
| middle of wafer | \ | \ | 1.68E + 13 | 5.09E + 10 | 1.25E + 09 |
| at −0.42 um | \ | \ | \ | \ | \ |
| at interface | 2.90E + 0.8 | 7.23E + 09 | 1.77E + 12 | \ | 3.13E + 09 |

TABLE 3

(METALS)
Calculated dose at the interfaces (cm$^{-2}$).

| Element | Min Det. FZ Si | Wafer Slot #2 interface: | | Wafer Slot #6 interface: | | Wafer Slot #7 interface: | | Wafer Slot #11 interface: | |
|---|---|---|---|---|---|---|---|---|---|
|  |  | SiO$_2$/SiO$_2$ | SiO$_2$/Si | SiO$_2$/SiO$_2$ | SiO$_2$/Si | SiO$_2$/SiO$_2$ | SiO$_2$/Si | SiO$_2$/SiO$_2$ | SiO$_2$/Si |
| Mg | 1E8 | N/D | 3.2E8 | N/D | 4.2E8 | N/D | 2.0E8 | N/D | 1.4E9 |
| Al | 1E9 | 1.8E11 | N/D | 1.9E10 | N/D | 1.5E11 | N/D | 4.3E10 | N/D |
| Cr | 2E8 | 3.6E10 | 1.1E10 | 5.2E9 | 2.7E9 | 3.9E10 | 7.4E9 | 5.4E9 | 3.4E9 |
| Fe | 1E9 | 6.8E10 | N/D | 8.0E9 | N/D | 4.0E10 | N/D | 8.0E9 | N/D |
| Ni | 5E9 | N/D | N/D | N/D | N/D | N/D | N/D | N/D | N/D |

1.8 E+11 at/cm$^2$ at the SiO$_2$/SiO$_2$ interface on the wafer in slot 2 to 4.3 E+10 at/cm$^2$ at the same location on the wafer in slot 11. The areal density of Al at the interface on the wafer in slot 6 was 1.9 E+10, a value slightly lower than the value detected at slot 11.

Table 4 shows a comparison of the reduction in areal densities based on the peak values of the contaminant levels observed on the processed wafers. As shown in Table 4, the areal density of Na and Li decreased by two orders of magnitude, and K decreased by one order of magnitude when the bias RF power increased from 1600 W to 3000 W (power density of about 0.051 W/mm$^2$ to about 0.095 W/mm$^2$). The peak areal density of Fe decreased by about one order of magnitude between the wafers in slots 2 and 11 when the season time increased from 30 to 110 seconds, while the peak values for the other metals remained about the same.

From the results described above and shown in Tables 2, 3 and 4, the inventors have concluded that increasing the bias RF power during the season step after the inductive and capacitive cleaning processes decreases the mobile ion (alkali metal) contamination by at least one order of magnitude. The metal contamination can also be decreased by about one order of magnitude by increasing the season time, which may indicate that the primary source of the metal contaminants is the chamber wall which is made of 6061 Al. This Al alloy contains the following elements as impurities added to strengthen the metal: (wt. %) Fe=0.4, Cr=00.15, Ni=0.1, etc. The increased season time results in the deposition of a thicker SiO$_2$ film on the chamber walls, thus isolating the 6061 Al chamber walls from the substrate and so lowering the metal contamination.

It is believed that the increased bias RF power utilized during the season step results in thicker SiO$_2$ coatings on the Si top lid and quartz dome since the quartz dome, quartz process kit, silicon top lid, and chamber o-rings are possible sources of mobile ion contaminants (Na, K, Li). An alternate explanation is that the higher bias RF power results in increased volatilization of mobile ion contaminants from the silicon substrate, thus depositing them on cooler chamber parts. The most likely explanation seems to be that the increased bias RF power results in a hotter quartz process kit which could result in volatilization of mobile ions from the lid and also increased sputtering from the lid. Thus, the volatilized contaminants may condense in cooler areas in the chamber and are removed from the vicinity of the substrate, thus reducing subsequent contamination of the substrates.

TABLE 4

(Peak Values)
Contaminant Levels as a Function of Season Time and BRF Power (Peak Values, at/cm3)
HDP CVD Rev. 1 Chamber

| | | Mobile ion Contaminants (at/cm3) | | | Metal Contaminants (at/cm3) | | | | | Others (at/cm3) |
|---|---|---|---|---|---|---|---|---|---|---|
| Slot | Clean Recipe | Na | Li | K | Fe | Cr | Ni | Mg | Al | F |
| 2 | 4500/1600-30 sec Season | 1.00E + 17 | 5.00E + 16 | 1.00E + 16 | 1.50E + 16 | 8.00E + 15 | 4.00E + 15 | 2.60E + 14 | 5.00E + 15 | 2.50E + 19 |
| 3 | 4500/1600-50 sec Season | 4.00E + 16 | 3.00E + 15 | 1.00E + 16 | | | | | | 2.00E + 19 |
| 4 | 4500/1600-70 sec Season | 3.00E + 16 | 2.00E + 16 | 7.00E + 15 | | | | | | 1.50E + 19 |
| 5 | 4500/1600-90 sec Season | 5.00E + 16 | 1.00E + 15 | 5.00E + 15 | | | | | | 1.50E + 19 |
| 6 | 4500/1600-110 sec Season | 5.00E + 16 | 7.50E + 14 | 5.00E + 15 | 3.00E + 15 | 1.00E + 15 | 3.60E + 15 | 2.00E + 14 | 2.50E + 15 | 1.00E + 19 |
| 7 | 4500/2500-30 sec Season | 3.00E + 16 | 2.00E + 15 | 2.00E + 16 | 1.50E + 16 | 1.00E + 16 | 3.60E + 15 | 4.00E + 14 | 2.00E + 16 | 2.00E + 19 |
| 8 | 4500/2500-50 sec Season | 6.00E + 16 | 8.50E + 14 | 1.60E + 16 | | | | | | 1.50E + 19 |
| 9 | 4500/2500-70 sec Season | 5.50E + 16 | 7.00E + 14 | 1.00E + 16 | | | | | | 1.50E + 19 |
| 10 | 4500/2500-90 sec Season | 6.00E + 18 | 2.00E + 15 | 1.50E + 16 | | | | | | 1.50E + 19 |
| 11 | 4500/2500-110 sec Season | 4.00E + 16 | 1.50E + 15 | 2.50E + 16 | 5.00E + 15 | 1.50E + 15 | 2.50E + 15 | 8.00E + 14 | 3.50E + 15 | 1.00E + 19 |
| 12 | 4500/3000-30 sec Season | 5.00E + 16 | 3.00E + 14 | 2.50E + 15 | | | | | | 4.00E + 18 |

In any case, it is possible to reduce mobile ion contamination by increasing bias RF power while maintaining season time. This solution is elegant since the throughput on the system will not be decreased. However, the ideal solution would be to decrease both metal and mobile ion concentrations by using a high bias RF power density of about 0.095 W/mm$^2$ to about 0.111 W/mm$^2$ and a season time of from about 50–70 seconds.

EXAMPLE 2

The present invention also has application with substrates greater than 200 mm as well as less than 200 mm. By way of prophetic example, the present invention can be used to advantage in a 300 mm substrate process. Typically during the deposition process in a 300 mm application, a source RF power of about 10,125 W (power density of about 0.143 W/mm$^2$) is coupled to the inductive coil and a bias RF power of about 5600 W (power density of about 0.079 W/mm$^2$) is coupled to the conductive or semi-conductive lid of the chamber during a SiO$_2$ deposition process. During a typical clean process, a source RF power of about 11,250 W (power density of about 0.59 W/mm$^2$) is coupled to the coil and a season step is carried out with a source RF power of about 10,125 W (power density of about 0.143 W/mm$^2$) and a bias RF power of about 3600 W (power density of about 0.051 W/mn$^2$). In accordance with the present invention, a season step may be performed within the chamber by applying a source RF power of about 10,125 W (power density of about 0.143 W/mm$^2$), as used in the process recipe, and coupling a bias RF power of about 6750 W (power density of about 0.095 W/mm$^2$) to the conductive or semi-conductive lid. By increasing the bias RF power density to more than 0.051 W/mm$^2$, it is theorized that the same effects and advantages as seen and achieved in Example 1 will also be realized on a larger substrate.

While the foregoing is directed to a preferred embodiment of the present invention, other and further embodiments of the invention may be devised without departing from the basic scope thereof, and the scope thereof is determined by the claims which follow.

What is claimed is:

1. A method for reducing contaminants in a processing chamber comprising chamber walls and chamber components which include insulative components and conducting and semiconducting components, the method comprising the steps of:
   a) providing a cleaning gas into the chamber;
   b) cleaning the insulative components of the chamber by coupling RF power to an inductive coil;
   c) cleaning the conducting and semiconducting components of the chamber by coupling bias RF power; and
   d) seasoning the chamber following the cleaning steps by depositing a film in the chamber by providing precursor gases into the chamber and coupling bias RF power at a density greater than about 0.08 W/mm$^2$ and coupling RF power to the inductive coil and depositing the film for at least about 30 seconds.

2. The method of claim 1, wherein the cleaning gas comprises fluorinated compounds.

3. The method of claim 2, wherein the cleaning gas is selected from the group consisting of $NF_3$, $CF_4$, and $C_2F_6$.

4. The method of claim 1, wherein the deposition material is a silicate glass.

5. The method of claim 4, wherein the silicate glass is doped.

6. The method of claim 1, wherein the deposition material is silicon dioxide.

7. The method of claim 6, wherein the silicon dioxide is deposited by providing silane into the chamber as a precursor gas.

8. The method of claim 1, wherein the deposition material is silicon oxyfluoride.

9. The method of claim 1, wherein the bias RF power density is in a range of from about 0.095 $W/mm^2$ to about 0.11 $W/mm^2$, the source RF power density is about 0.14 $W/mm^2$ and the material is deposited for about 50 to about 70 seconds.

10. A method for seasoning internal surfaces of a processing chamber having a lid and an inductive coil, comprising the steps of:
   a) supplying at least one deposition precursor gas into the chamber; and
   b) seasoning the chamber by depositing a material in the chamber by providing bias RF power at a density of at least about 0.08 $W/mm^2$ and a source RF power at a density of at least 0.14 $W/mm^2$ to the chamber and depositing the material for at least about 30 seconds.

11. The method of claim 10, wherein the deposition material is silicon dioxide or FSG.

12. The method of claim 11, wherein the deposition precursor gas is silane.

13. The method of claim 12, wherein the bias RF power density is about 0.095 $W/mm^2$ and the source RF power density is about 0.143 $W/mm^2$.

14. A method for reducing particles within a processing environment during a deposition process, comprising the steps of:
   a) flowing one or more precursor gases into the chamber;
   b) seasoning the chamber by providing a first bias RF power density greater than about 0.051 $W/mm^2$ and a first source RF power density;
   c) flowing deposition gases into the chamber; and
   d) depositing a deposition material on a substrate within the chamber by providing a second bias RF power density less than the first bias RF power density and by providing a second source RF power density equal to or less than the first source RF power density.

15. The method of claim 14, wherein the bias RF power is applied to a chamber lid and the source RF is applied to an inductive source.

16. The method of claim 12, wherein the deposition material is doped or undoped silicate glass.

17. The method of claim 12, wherein the deposition material is silicon dioxide or silicon oxyfluoride.

18. The method of claim 14, wherein seasoning occurs for a period of time greater than about 30 seconds.

* * * * *

UNITED STATES PATENT AND TRADEMARK OFFICE
CERTIFICATE OF CORRECTION

PATENT NO : 5,811,356

DATED : September 22, 1998

INVENTOR(S): Laxman Murugesh, Pravin Narwankar, Turgut Sahin, Kent Rossman

It is certified that error appears in the above-identified patent and that said Letters Patent is hereby corrected as shown below:

In column 8, Table 2, slot 3, under column "Na", please replace "5.83E + 10" with -- 5.63E + 10 --.

In column 8, Table 2, slot 5, under column "Li", please replace "1.29E + 09" with -- 1.29E + 08 --.

In column 8, Table 2, slot 6, under column "F", please replace "3.95E + 13" with --3.85E + 13 --.

In column 11, Table 4, slot 2, under column "Mg", please replace "2.60E + 14" with --2.50E + 14 --.

In column, 11, line 65, please replace "W/mn$^2$" and insert --W/mm$^2$--.

Signed and Sealed this

Twenty-eighth Day of December, 1999

Attest:

Q. TODD DICKINSON

*Attesting Officer*   *Acting Commissioner of Patents and Trademarks*